(12) United States Patent
Kang

(10) Patent No.: US 7,110,291 B2
(45) Date of Patent: Sep. 19, 2006

(54) NANO TUBE CELL, AND SEMICONDUCTOR DEVICE HAVING NANO TUBE CELL AND DOUBLE BIT LINE SENSING STRUCTURE

(75) Inventor: Hee Bok Kang, Daejeon (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 203 days.

(21) Appl. No.: 10/878,375

(22) Filed: Jun. 29, 2004

(65) Prior Publication Data

US 2005/0254284 A1    Nov. 17, 2005

(30) Foreign Application Priority Data

May 17, 2004   (KR) .................. 10-2004-0034829

(51) Int. Cl.
*G11C 11/36* (2006.01)

(52) U.S. Cl. .................. 365/175; 365/149; 365/151; 257/46

(58) Field of Classification Search ............... 365/175, 365/149, 151; 257/46
See application file for complete search history.

(56) References Cited

U.S. PATENT DOCUMENTS

| | | | | |
|---|---|---|---|---|
| 4,090,254 A * | 5/1978 | Ho et al. ................ 365/150 |
| 6,346,023 B1 * | 2/2002 | Tsuboi et al. ............. 445/46 |
| 6,625,057 B1 * | 9/2003 | Iwata ..................... 365/158 |
| 6,885,600 B1 * | 4/2005 | Tran et al. ............... 365/205 |
| 6,891,191 B1 * | 5/2005 | Xiao et al. ................ 257/40 |
| 6,956,767 B1 * | 10/2005 | Kang ...................... 365/175 |
| 6,990,009 B1 * | 1/2006 | Bertin et al. ............. 365/151 |
| 6,995,649 B1 * | 2/2006 | Nugent ................... 338/20 |
| 7,019,391 B1 * | 3/2006 | Tran ....................... 257/678 |
| 7,039,619 B1 * | 5/2006 | Nugent .................... 706/15 |
| 2005/0180193 A1 * | 8/2005 | Kang ...................... 365/149 |
| 2005/0180194 A1 * | 8/2005 | Kang ...................... 365/149 |

\* cited by examiner

*Primary Examiner*—Viet Q. Nguyen
(74) *Attorney, Agent, or Firm*—Heller Ehrman LLP

(57) ABSTRACT

The present invention discloses a nano tube cell, and a semiconductor device having the nano tube cell and a double bit line sensing structure. The cell array circuit includes a plurality of top sub cell arrays, a plurality of bottom sub cell arrays, a main bit line sense amp and a word line driving unit. Especially, the top and bottom sub cell arrays have a double bit line sensing structure for inducing a sensing voltage of a main bit line by controlling a volume of a current supplied from a power voltage to the main bit line according to a sensing voltage of a sub bit line receiving a cell data. Each of the sub cell arrays includes a capacitor, and a PNPN nano tube cell having a PNPN diode switch selectively turned on/off according to a voltage difference between one side terminal of the capacitor and the sub bit line, to decrease a cell size and improve operational characteristics of the circuit.

5 Claims, 12 Drawing Sheets

US 7,110,291 B2

NANO TUBE CELL, AND SEMICONDUCTOR DEVICE HAVING NANO TUBE CELL AND DOUBLE BIT LINE SENSING STRUCTURE

BACKGROUND OF THE INVENTION

1. Field of the Invention

The present invention relates to a semiconductor memory, and more particular to a nano tube cell using a PNPN diode as a unit switch device, and a semiconductor device having a double bit line sensing structure which can induce a sensing voltage of a main bit line by using a current gain according to a cell data.

2. Description of the Background Art

In a gigabyte-level DRAM, a memory capacity increases, a cell size decreases, and a cell capacitance decreases.

In order to stably operate a memory having a small cell capacitance, a capacitance of a bit line must be reduced. It is not easy to reduce the capacitance of the bit line in a high integration memory. In addition, an interval between the bit lines is small in the high integration memory. As a result, unnecessary power consumption may be caused by short channels in a cell structure using an NMOS transistor.

SUMMARY OF THE INVENTION

The present invention is achieved to solve the above problems. Accordingly, it is an object of the present invention to decrease a cell size and improve operational characteristics of a cell array circuit, by reducing a capacitance of each cell by improving a structure of the cell array circuit.

In order to achieve the above-described object of the invention, there is provided a PNPN nano tube cell, including: a capacitor for storing cell charges corresponding to a cell data, a first electrode of which being coupled to a word line; a first PNPN tube coupled between a second electrode of the capacitor and a bit line, and turned on when a voltage of the bit line is higher than that of the second electrode by a predetermined level, for enabling a current to flow from the bit line to the capacitor; and a second PNPN tube coupled between the second electrode and the bit line, and turned on when the voltage of the second electrode is higher than that of the bit line by a predetermined level, for enabling the current to flow from the capacitor to the bit line.

According to another aspect of the present invention, a semiconductor device having a double bit line sensing structure includes: a plurality of top sub cell arrays and a plurality of bottom sub cell arrays having a double bit line sensing structure for inducing a sensing voltage of a main bit line, by controlling an amount of a current supplied from a power voltage to the main bit line according to a sensing voltage of a sub bit line receiving a cell data; a main bit line sense amp disposed between the plurality of top sub cell arrays and the plurality of bottom sub cell arrays, for sensing and amplifying a sensing voltage of a top main bit line shared by the plurality of top sub cell arrays and a sensing voltage of a bottom main bit line shared by the plurality of bottom sub cell arrays according to a sensing signal; and a word line driving unit for selectively enabling word lines of the sub cell arrays for the read and write operation of the cell data, wherein, in each of the sub cell arrays, a memory cell including a capacitor and a switch device selectively turned on/off according to a voltage difference between one side terminal of the capacitor and the sub bit line is coupled between the word line and the sub bit line.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

A nano tube cell, and a cell array circuit having the nano tube cell and a double bit line sensing structure in accordance with a preferred embodiment of the present invention will now be described in detail with reference to the accompanying drawings.

Figure 1:
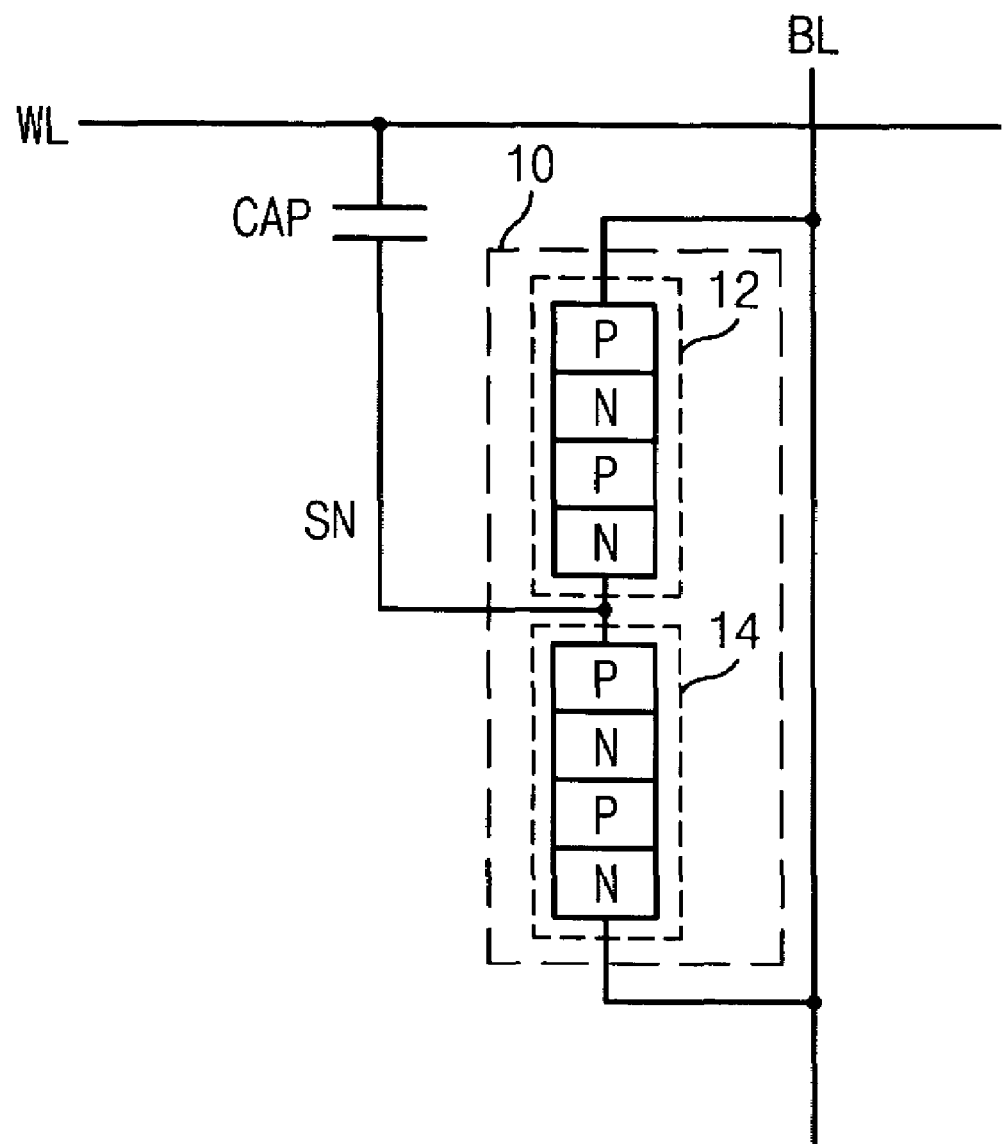
FIG. 1 is a circuit diagram illustrating a unit nano tube cell in accordance with a preferred embodiment of the present invention.

FIG. 1 is a circuit diagram illustrating a unit nano tube cell in accordance with the preferred embodiment of the present invention.

The nano tube cell includes one capacitor CAP and one PNPN diode switch 10.

The capacitor CAP stores cell charges corresponding to a cell data. One side electrode of the capacitor CAP is coupled to a word line WL, and the other side electrode thereof is coupled to a node SN. In the PNPN diode switch 10, a pair of serial PNPN tubes 12 and 14 are connected in parallel to a bit line BL, and the node SN is formed between the serial PNPN tubes 12 and 14. That is, an N terminal of the PNPN tube 12 and a P terminal of the PNPN tube 14 are commonly connected to the node SN, and a P terminal of the PNPN tube 12 and an N terminal of the PNPN tube 14 are commonly connected to the bit line BL.

The PNPN diode switch 10 selectively switches a direction of a current between the bit line BL and the capacitor CAP according to variations of a voltage between the bit line BL and the capacitor CAP by using a serial PN diode chain switch technology.

Figure 2:
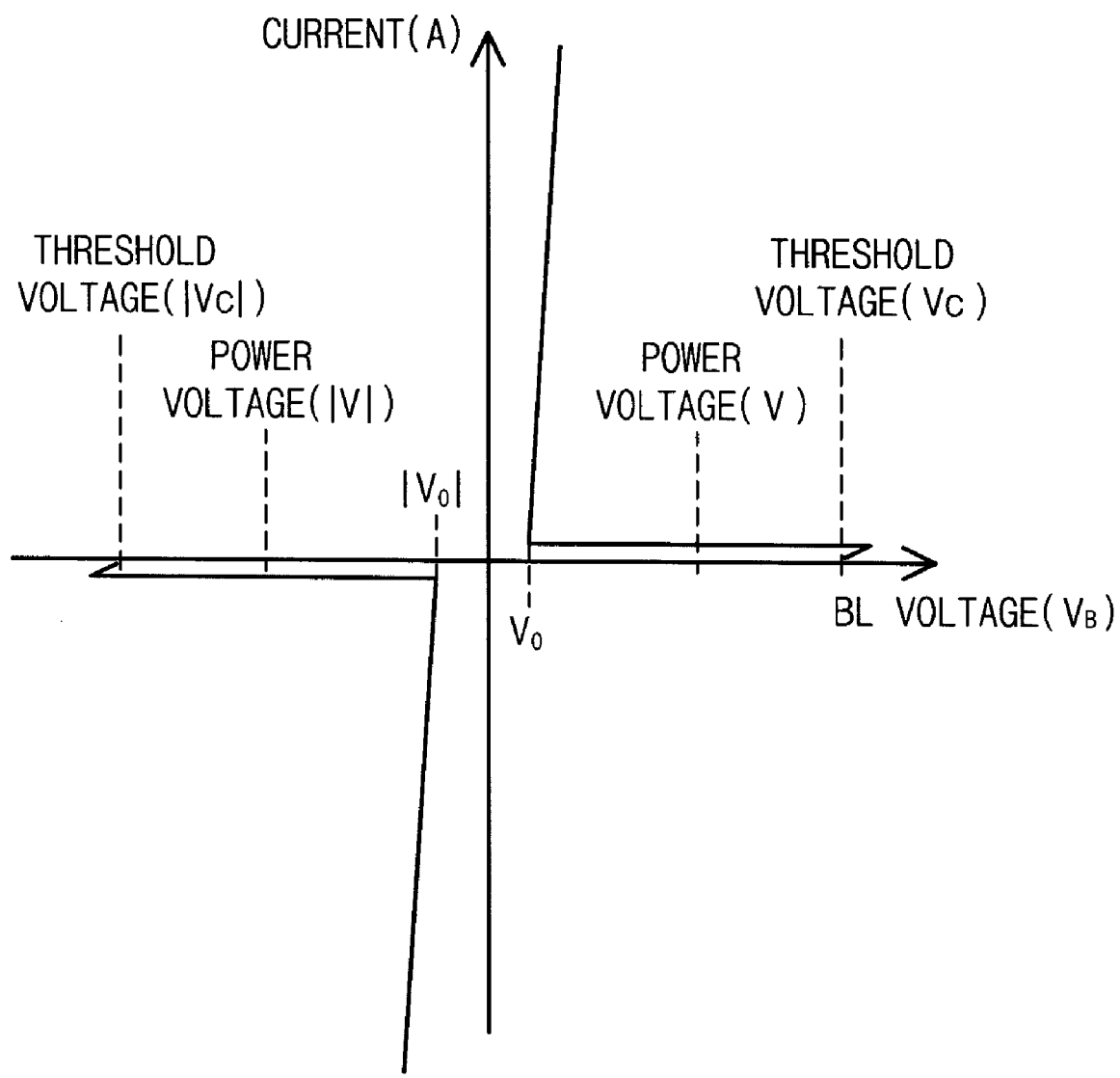
FIG. 2 is a graph showing an operational principle of a PNPN diode switch of FIG. 1.

FIG. 2 is a graph showing an operational principle of the PNPN diode switch 10 of FIG. 1.

In the case that a voltage $V_B$ of the bit line BL increases in a positive direction on the node SN, when the voltage $V_B$ of the bit line BL is a power voltage V, the PNPN diode switch 10 maintains an off state according to characteristics of a PNPN diode of the PNPN tube 12. However, when the voltage $V_B$ of the bit line BL is increased to a critical voltage $V_C$, the PNPN tube 12 is turned on, and thus the current flowing from the bit line BL to the capacitor CAP sharply increases. When the PNPN tube 12 is turned on, the both end voltage of the PNPN tube 12 is decreased to $V_O$. Here, the PNPN tube 14 maintains an off state by a reverse voltage.

Conversely, when the voltage $V_B$ of the bit line BL increases in a negative direction on the node SN, namely when a predetermined voltage is applied to the word line WL, the PNPN tube 14 is operated in the same manner as the PNPN tube 12.

Figure 3:
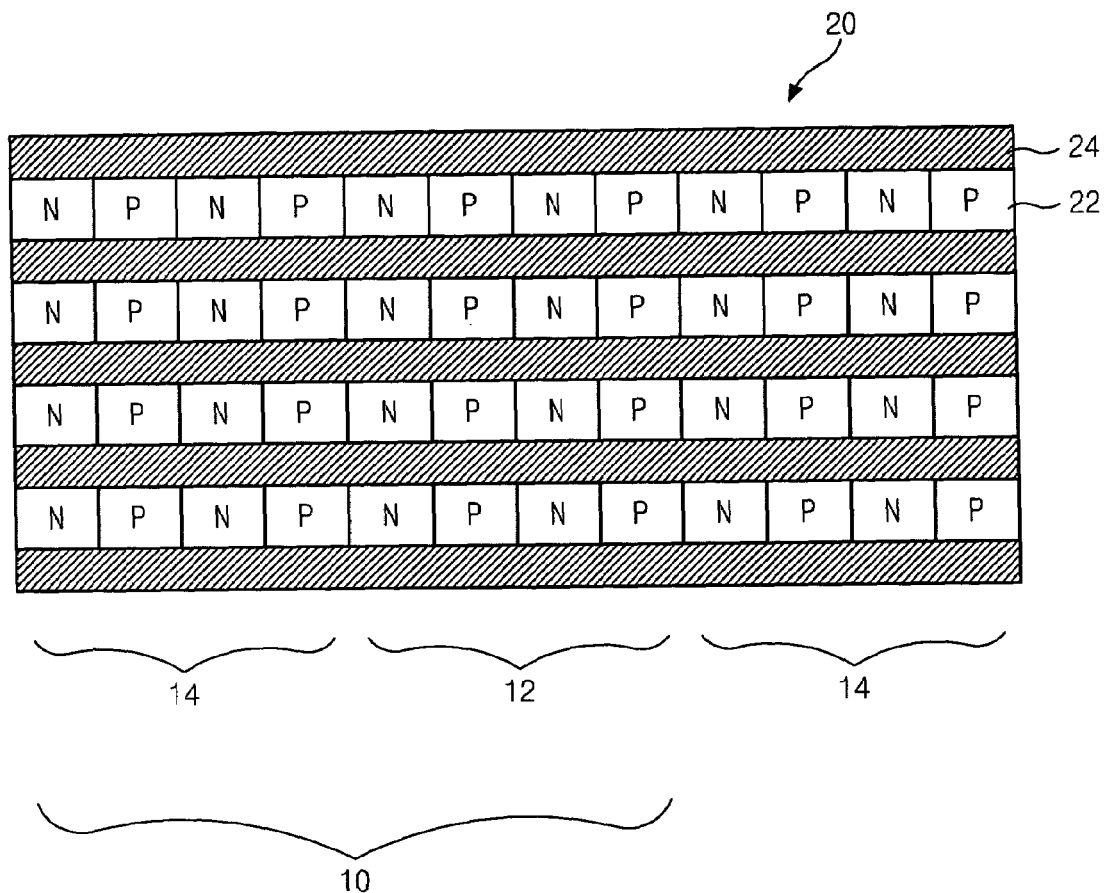
FIG. 3 is a plane diagram illustrating a serial PNPN tube chain layer in accordance with the preferred embodiment of the present invention.

FIG. 3 is a plane diagram illustrating a serial PNPN tube chain layer in accordance with the preferred embodiment of the present invention.

In the serial PNPN tube chain layer 20, a plurality of parallel serial PNPN tube chains 22 and a plurality of insulation isolation layers 24 are formed on a grown silicon layer or a polysilicon layer. In the serial PNPN tube chains 22, PN diodes are connected in series in a chain shape. The serial PNPN tube chains 22 are formed in parallel to each other at predetermined intervals. The insulation isolation layers 24 are formed between the serial PNPN tube chains 22.

In each of the serial PNPN tube chains 22, the PNPN tubes 12 and the PNPN tubes 14 are consecutively connected in series. The PNPN diode switches 10 corresponding to each cell are formed by consecutively selecting one PNPN tube 12 and one PNPN tube 14 connected in series to the PNPN tube 12 from the serial PNPN tube chain 22.

Accordingly, the capacitor CAP can be positioned in the cross region of the serial PNPN tube chain 22 and the word line WL without using an NMOS transistor, by using the PNPN diode as a switch device for forming a memory cell, which results in a very small cell size. The PNPN diode which is a switch having two connection electrode nodes efficiently performs the read and write operations, thereby improving operational characteristics of the circuit.

Figure 4:
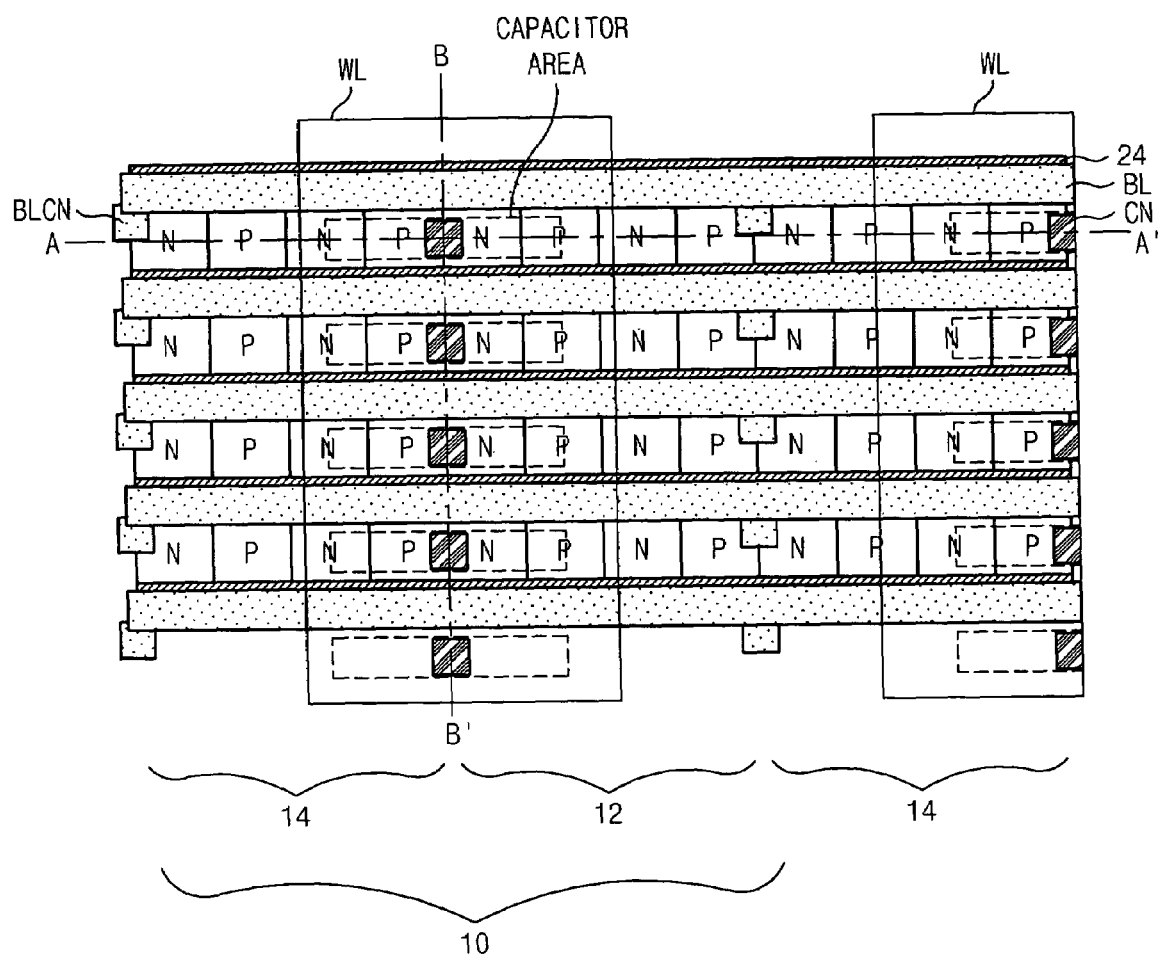
FIG. 4 is a plane diagram illustrating a word line, a bit line and a capacitor formed on the serial PNPN tube chain layer of FIG. 3.

FIG. 4 is a plane diagram illustrating the word line WL, the bit line BL and the capacitor CAP formed above the serial PNPN tube chain layer 20 of FIG. 3.

The bit line BL is formed above the contact surface of the serial PNPN tube chain 22 and the insulation isolation layer 24 in parallel to the serial PNPN tube chain 22. The bit line BL is coupled to the corresponding P terminal of the PNPN tube 12 and the corresponding N terminal of the PNPN tube 14 through a bit line contact node BLCN. Here, the bit line contact node BLCN is commonly connected to the P terminal of the PNPN tube 12 and the N terminal of the PNPN tube 14 of the adjacent cell to be shared by the PNPN diode switch 10 of the adjacent cell.

A capacitor contact node CN is commonly connected to the N terminal of the PNPN tube 12 and the P terminal of the PNPN tube 14 in each serial PNPN tube chain 22. The word line WL is coupled to top electrodes of the capacitors CAP in the orthogonal direction to the serial PNPN tube chain 22.

Since a cross-point cell including the capacitor CAP located where the word line WL and the serial PNPN tube chain 22 are crossed is formed in the embodiment according to the present invention, additional area for forming a cell is not required.

Figure 5A:
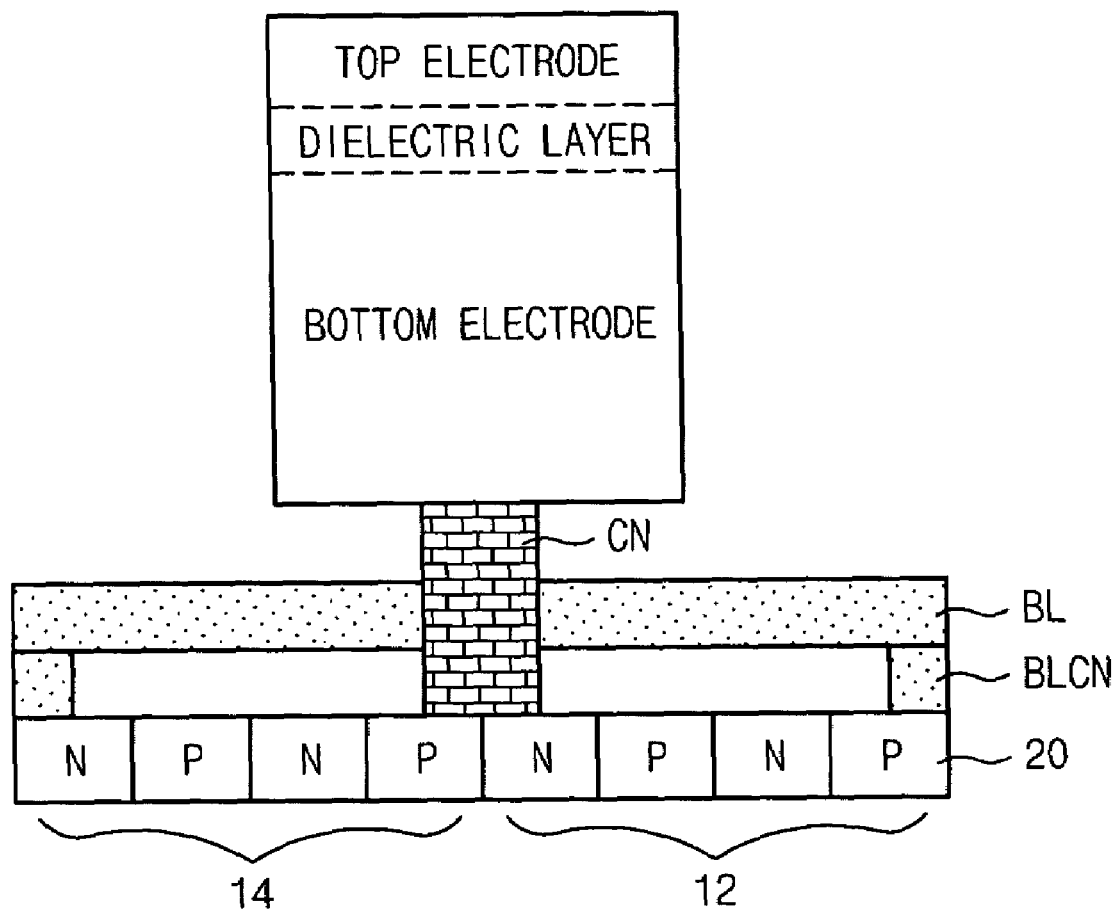
FIGS. 5a and 5b are cross-sectional diagrams illustrating one nano tube cell of FIG. 4.
Figure 5B:
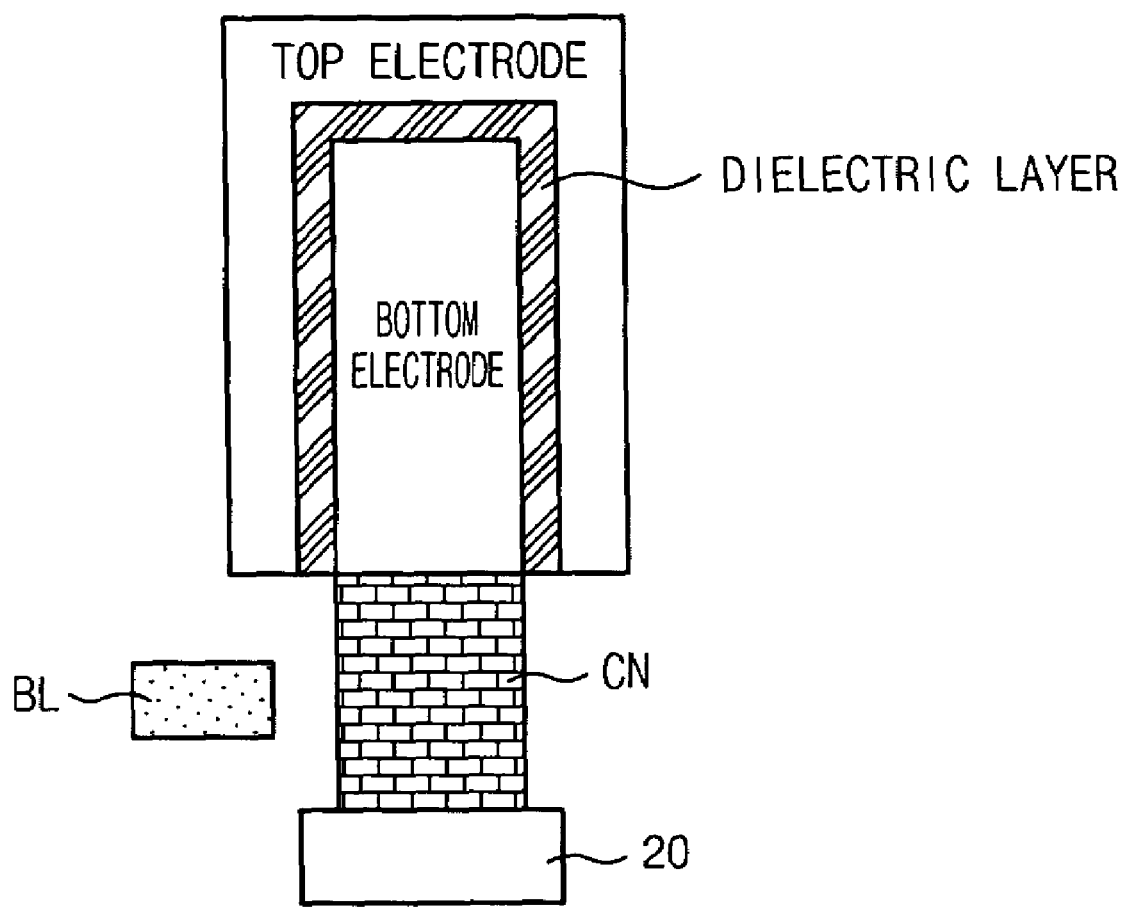

FIGS. 5a and 5b are cross-sectional diagrams illustrating one nano tube cell of FIG. 4.

FIG. 5a is a cross-sectional diagram illustrating the nano tube cell, taken along line A–A', and FIG. 5b is a cross-sectional diagram illustrating the nano tube cell, taken along line B–B'.

The serial PNPN tube chains 22 are separately formed by using a deposition semiconductor layer. In each PNPN tube chain 22, the PNPN tube 12 region and the PNPN tube 14 region are connected in series. The bit line contact nodes BLCN are formed on the P terminal positioned in the end of the PNPN tube 12 and the N terminal positioned in the end of the PNPN tube 14, respectively. The bit line contact nodes BLCN are coupled to the bit line BL. The capacitor contact node CN is commonly connected onto the N terminal positioned in the end of the PNPN tube 12 and the P terminal positioned in the end of the PNPN tube 14. The contact node CN is coupled to a bottom electrode of the capacitor CAP.

Here, the bottom electrode is thinly widely formed above the serial PNPN tube chain 22 in the vertical direction in parallel to the bit line BL. That is, the bottom electrode is formed in a rectangular column shape so that a long axis of the rectangle can be parallel to the bit line BL and a short axis thereof can be parallel to the word line WL.

As shown in FIG. 5b, a dielectric film of the capacitor CAP is stacked on the surface of the bottom electrode. A top electrode is formed on the surface of the dielectric film to wholly cover the dielectric film, and coupled to the word line WL.

Therefore, an effective area of the capacitor CAP can be increased in a small area.

Figure 6:
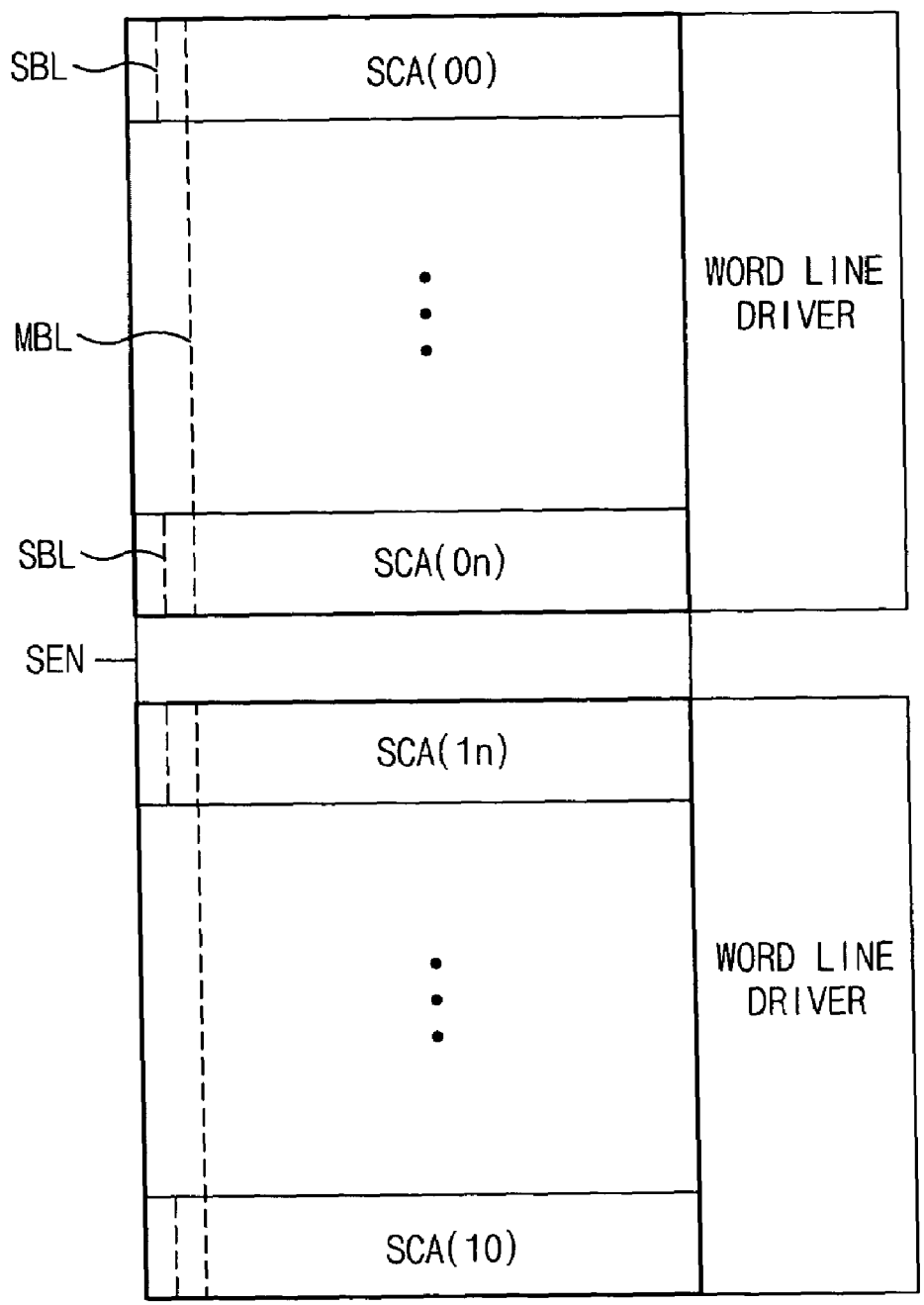
FIG. 6 is a structure diagram illustrating a cell array circuit in accordance with the preferred embodiment of the present invention.

FIG. 6 is a structure diagram illustrating a cell array circuit in accordance with the preferred embodiment of the present invention.

Referring to FIG. 6, the cell array circuit includes a plurality of top sub cell arrays SCA(00) to SCA(0n), a plurality of bottom sub cell arrays SCA(10) to SCA(1n), a main bit line sense amp MBL_SA, and word line drivers.

The plurality of top sub cell arrays SCA(00) to SCA(0n) and the plurality of bottom sub cell arrays SCA(10) to SCA(1n) are symmetrical to each other from the main bit line sense amp MBL_SA in the up/down direction. In the sub cell arrays SCA(00) to SCA(0n) and SCA(10) to SCA(1n), memory cells as shown in FIG. 1 are coupled to sub bit lines SBL, for storing data. The sub bit lines SBL are formed in each of the sub cell arrays SCA(00) to SCA(0n) and SCA(10) to SCA(1n). A main bit line MBL is shared by the sub cell arrays SCA(00) to SCA(0n) or SCA(10) to SCA(1n). In each of the sub cell arrays SCA(00) to SCA(0n) and SCA(10) to SCA(1n), the main bit line MBL corresponds to one or plural sub bit lines SBL, so that a sensing voltage of the main bit line MBL can be induced according to a cell data. That is, each of the sub cell arrays SCA(00) to SCA(0n) and SCA(10) to SCA(1n) has a double bit line sensing structure for generating the sensing voltage in the main bit line MBL by controlling an amount of a current applied to the main bit line MBL by a power voltage VCC according to the cell data applied to the sub bit lines SBL.

The main bit line sense amp MBL_SA is shared by a main bit line (top main bit line) of the top sub cell arrays SCA(00) to SCA(0n) and a main bit line (bottom main bit line) of the bottom sub cell arrays SCA(10) to SCA(1n) which are symmetrical, for amplifying the sensing voltage induced to the top or bottom main bit line MBL according to a sensing signal SEN.

The word line driver control the read/write operation of the cell data by selectively enabling word lines of the top sub cell arrays SCA(00) to SCA(0n) and the bottom sub cell arrays SCA(10) to SCA(1n).

Figure 7:
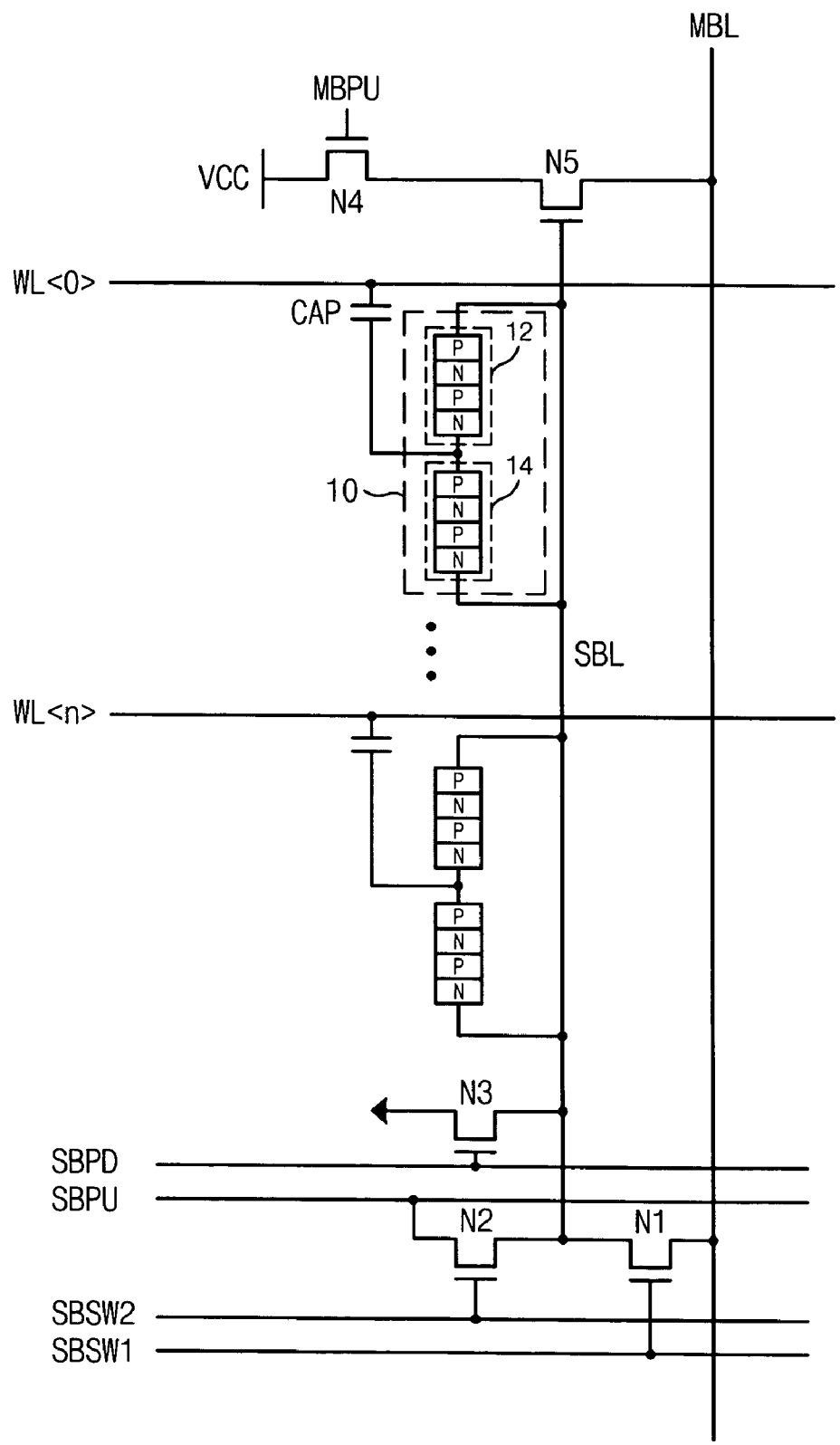
FIG. 7 is a detailed circuit diagram illustrating a first example of one sub cell array of FIG. 6.

FIG. 7 is a detailed circuit diagram illustrating a first example of one sub cell array of FIG. 6.

When a sub bit line select signal SBSW1 is enabled, an NMOS transistor N1 is turned on, and a load of the main bit line MBL is applied as much as that of one sub bit line SBL. In addition, when a sub bit line pull-down signal SBPD is enabled, an NMOS transistor N3 is turned on, and the sub bit line SBL is pulled down in a ground voltage level.

A sub bit line pull-up signal SBPU controls power supplied to the sub bit line SBL, and a sub bit line select signal SBSW2 controls the sub bit line pull-up signal SBPU to be applied to the sub bit line SBL. For example, in order to generate a high voltage in the sub bit line SBL, a higher voltage than the power voltage VCC is supplied as the sub bit line pull-up signal SBPU, and the sub bit line select signal SBSW2 is enabled. When an NMOS transistor N2 is turned on by the enabled sub bit line select signal SBSW2, the sub bit line pull-up signal SBPU having a high voltage is transmitted to the sub bit line SBL. The cells having the PNPN diode switches 10 are coupled between the sub bit line SBL and word lines WL<0> to WL<n>.

An NMOS transistor N4 is coupled between the power voltage VCC and an NMOS transistor N5, and has its gate connected to receive a main bit line pull-up signal MBPU. The NMOS transistor N5 is coupled between the NMOS transistor N4 and the main bit line MBL, and has its gate connected to the sub bit line SBL. When the main bit line pull-up signal MBPU is enabled, the NMOS transistor N5 controls the amount of a current supplied to the main bit line MBL by the power voltage VCC according to the sensing voltage of the sub bit line SBL. A data induced to the main bit line MBL is determined according to the amount of the current supplied to the main bit line MBL through the NMOS transistor N5. For example, when the cell data has a high level, a high cell voltage is applied to the sub bit line SBL, the amount of the current flowing through the NMOS transistor N5 becomes larger, and thus a high sensing voltage is induced to the main bit line MBL. Conversely, when the cell data has a low level, a low cell voltage is applied to the sub bit line SBL, the amount of the current flowing through the NMOS transistor N5 becomes smaller, and thus a low sensing voltage is induced to the main bit line MBL. That is, the data of the selected cell can be sensed by using a level difference of the sensing voltage induced to the main bit line MBL according to the cell data.

As described above, the voltage level of the sub bit line SBL and the main bit line MBL is maintained in a low level 0V during the precharge operation, by inducing the sensing voltage of the main bit line MBL by using the current gain according to the cell data. Accordingly, the current is not leaked in the precharge period by short channels of the bit lines.

In the PNPN diode switch 10, any one PNPN tube 12 or 14 is selectively turned on by the voltage applied to the word line WL and the sub bit line SBL, for reading or writing the cell data.

Figure 8:
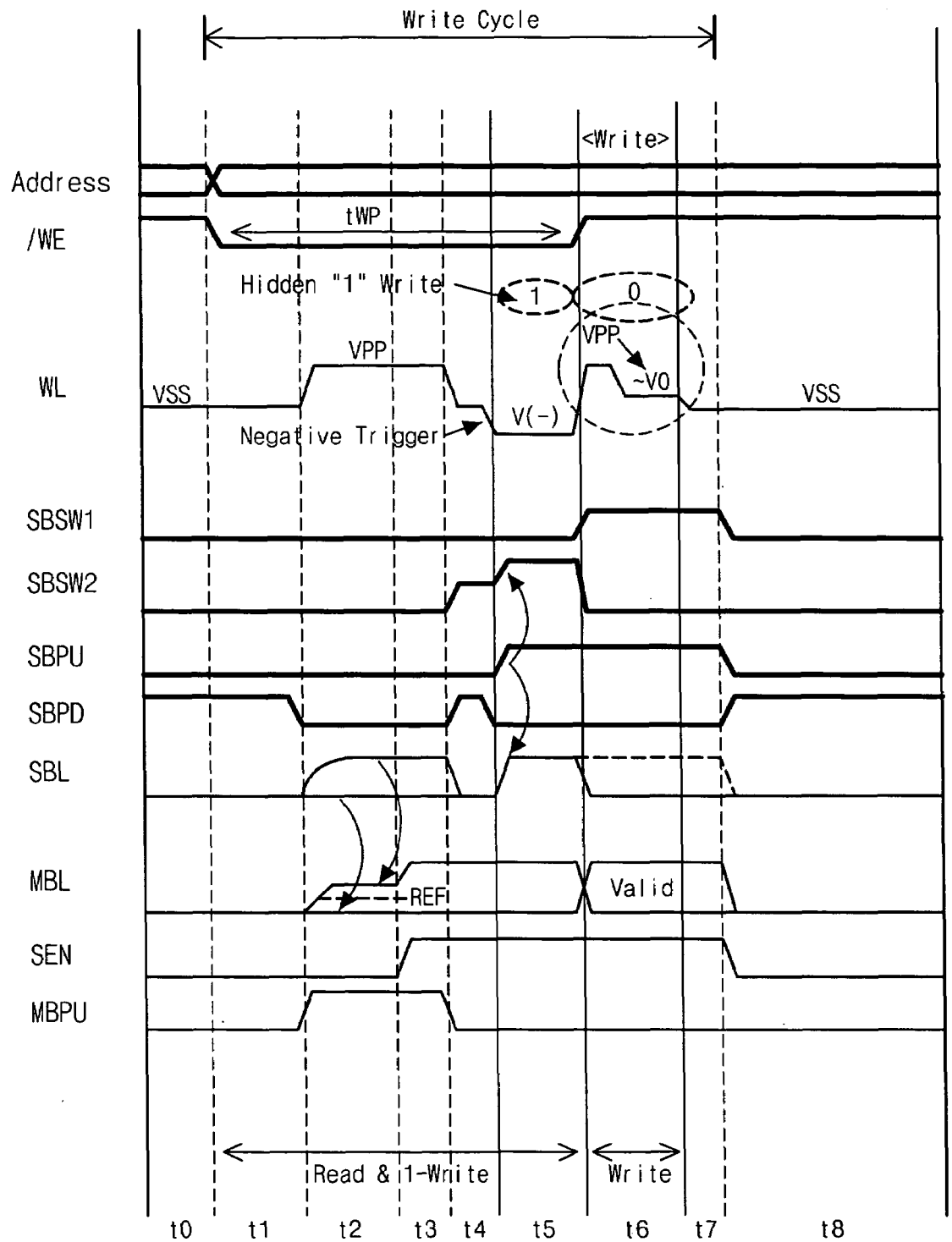
FIG. 8 is a timing diagram showing a write mode operation of the sub cell array of FIG. 7.

FIG. 8 is a timing diagram showing the write mode operation of the sub cell array of FIG. 7.

In t0 and t1 periods, the main bit line MBL and the sub bit line SBL are pulled down to a low level before the word line WL is enabled. In t1 period, when an address is transited and a write enable signal /WE is disabled in a low level, a write mode active state starts. Because the main bit line MBL and the sub bit line SBL are maintained in a low level before the word line WL is enabled, current leakage by the NMOS transistors coupled to the bit lines MBL and SBL or shorts are prevented, to reduce a standby current.

In t2 period, after the sub bit line pull down signal SBPD is transited to a low level, when the word line WL is enabled in a pumping level VPP, the PNPN tube 14 is turned on, for applying the cell data to the sub bit line SBL. In a state where the main bit line pull-up signal MPBU is enabled in a high level, when the cell data is applied to the sub bit line SBL, the NMOS transistor N5 is turned on, for supplying the current from the power voltage VCC to the main bit line MBL. Therefore, the sensing voltage is induced to the main bit line MBL.

The word line WL is maintained in a high level till t3 period, and transited to a ground voltage level VSS in t4 period. In t4 period, the sub bit line pull-down signal SBPD is re-enabled, and the sub bit line SBL is pulled down. The sub bit line select signal SBSW2 is enabled in a high level.

In t5 period, after the sub bit line pull-up signal SBPU is enabled in a high level, when the sub bit line select signal SBSW2 is pumped, a high voltage is applied to the sub bit line SBL. The word line WL is transited to a negative voltage V(−). The PNPN tube 12 is turned on by the high voltage of the sub bit line SBL and the negative trigger voltage V(−) of the word line WL, for recording a high level data on the cell capacitor CAP. In t5 period, data 1 is recorded on the whole cells coupled to the selected word line WL, regardless of an external data. Accordingly, this period is defined as a hidden 1 write period.

In t6 period, when the write enable signal /WE is enabled in a high level, the data write operation is performed. The sub bit line select signal SBSW2 is transited to a low level. In addition, the sub bit line select signal SBSW1 is enabled in a high level, and thus a write data transmitted to the main bit line MBL through a data bus (not shown) is transmitted to the sub bit line SBL and written on the cell. Here, when the data of the sub bit line SBL has a high level, the data Hidden 1 written in t5 period is maintained as it is, and when the data of the sub bit line SBL has a low level, the low level data is written on the corresponding cell. That is, t6 period is a period of writing an external low data 0 on the cell. Especially, in t6 period, after the word line WL is transited to the pumping level VPP, the voltage of the word line WL is decreased to ~$V_0$ approximate to $V_0$ of FIG. 2. When the pumping voltage VPP is continuously maintained in the word line WL in the data 0 write operation, a negative voltage is written and stored in the cell capacitor CAP. In order to write 0V of voltage instead of the negative voltage, the voltage of the word line WL is decreased to ~$V_0$ approximate to $V_0$. Accordingly, a minimum write current maintaining voltage can be applied to the capacitor CAP.

Figure 9:
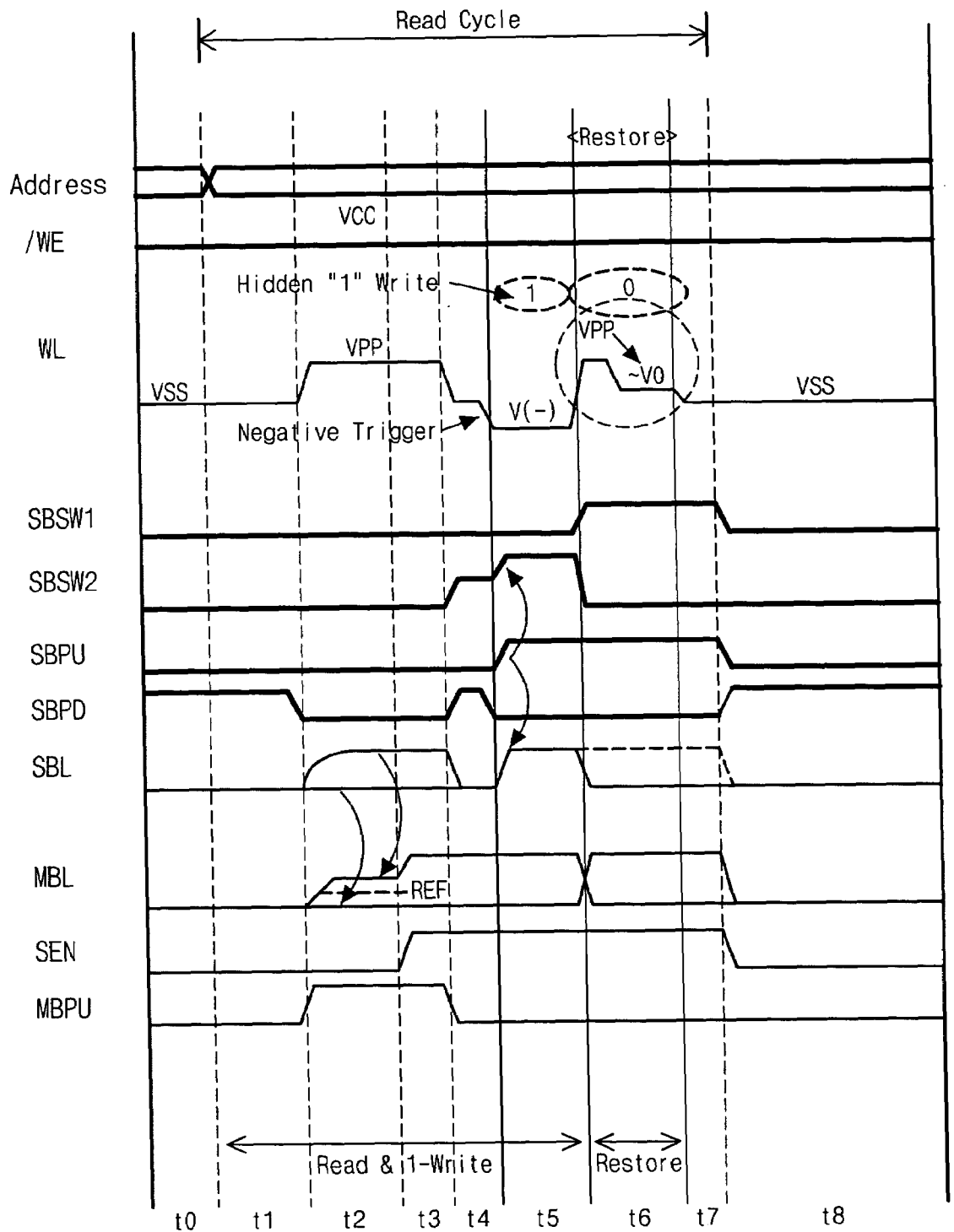
FIG. 9 is a timing diagram showing a read mode operation of the sub cell array of FIG. 7.

FIG. 9 is a timing diagram showing the read mode operation of the sub cell array of FIG. 7.

In the read mode, the write enable signal /WE maintains the power voltage level VCC.

t0 to t5 periods are identical to t0 to t5 periods of FIG. 8. That is, the data of the selected cell is sensed and outputted, and the hidden data 1 is recorded on the selected cell.

In t6 period, when the sub bit line select signal SBSW1 is enabled, a read data induced to the main bit line MBL is transmitted to the sub bit line SBL and restored on the cell. When the data of the sub bit line SBL has a high level, the data written in t5 period is maintained as it is, and when the data of the sub bit line SBL has a low level, the low data is restored on the corresponding cell. Thus, t6 period is a restore period of re-writing the low data 0 which has been internally sensed and amplified on the cell. Here, the main bit line MBL and the sub bit line SBL have the same voltage phase. As in the general hierarchical bit line structure, the voltage of the main bit line MBL is not inverted but transmitted directly to the sub bit line SBL.

Especially, in t6 period, after the word line WL is transited to the pumping level VPP, the voltage of the word line WL is decreased to ~$V_0$ approximate to $V_0$ of FIG. 2. When the pumping voltage VPP is continuously maintained in the word line WL in the data 0 write operation, a negative voltage is written and stored in the cell capacitor CAP. In order to write 0V of voltage instead of the negative voltage, the voltage of the word line WL is decreased to ~$V_0$ approximate to $V_0$. As a result, a minimum write current maintaining voltage can be applied to the capacitor CAP.

Figure 10:
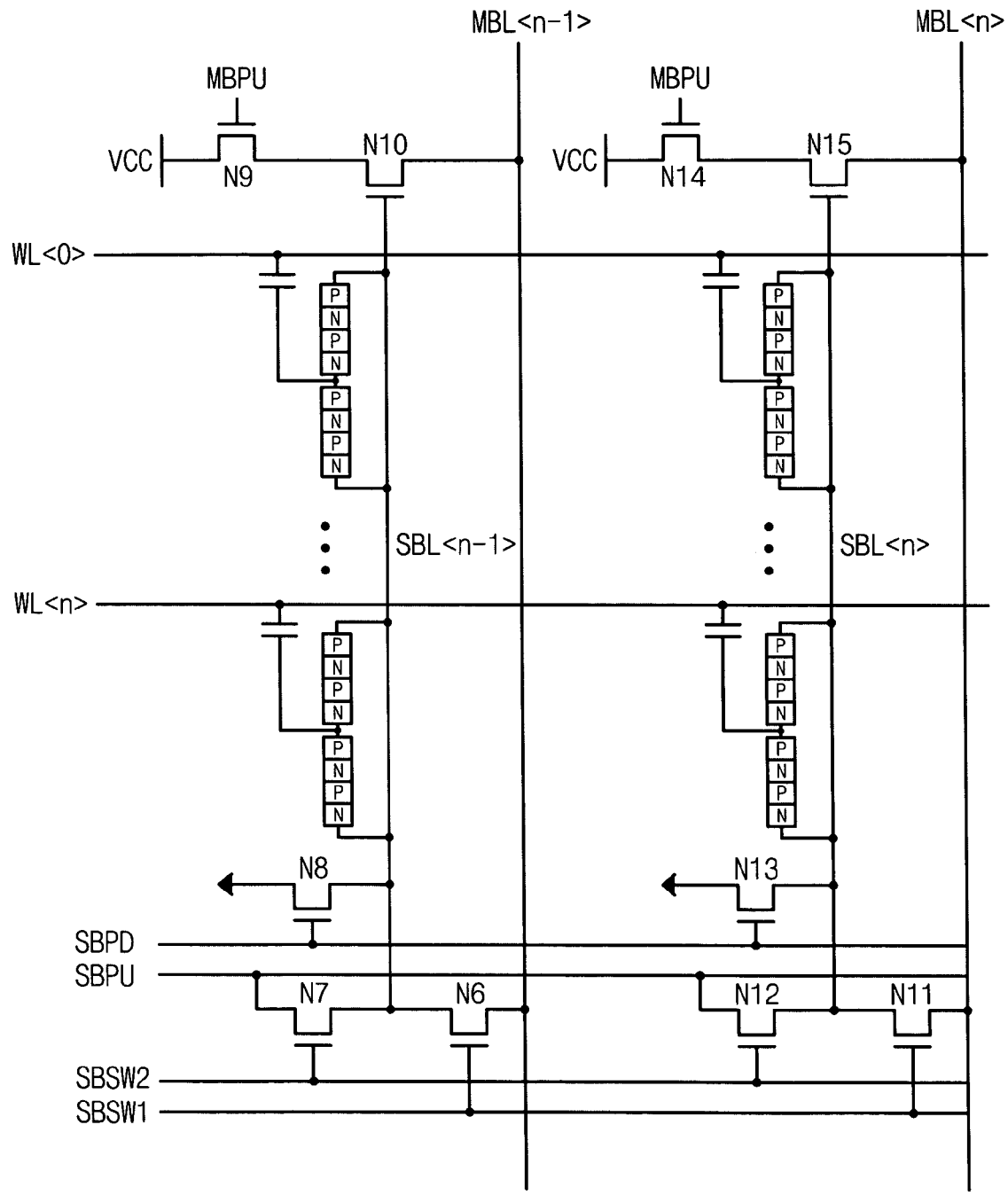
FIG. 10 is a detailed circuit diagram illustrating a second example of one sub cell array of FIG. 6.

FIG. 10 is a detailed circuit diagram illustrating a second example of one sub cell array of FIG. 6.

As illustrated in FIG. 10, in each sub cell array, adjacent sub bit lines SBL<n–1> and SBL<n> are connected in parallel in a double bit line sensing structure to correspond one by one to main bit lines MBL<n–1> and MBL<n>. The operations of the other constitutional elements, N7 to N15 are identical to those of the corresponding constitutional elements of FIG. 7, and thus detailed explanations thereof are omitted.

Figure 11:
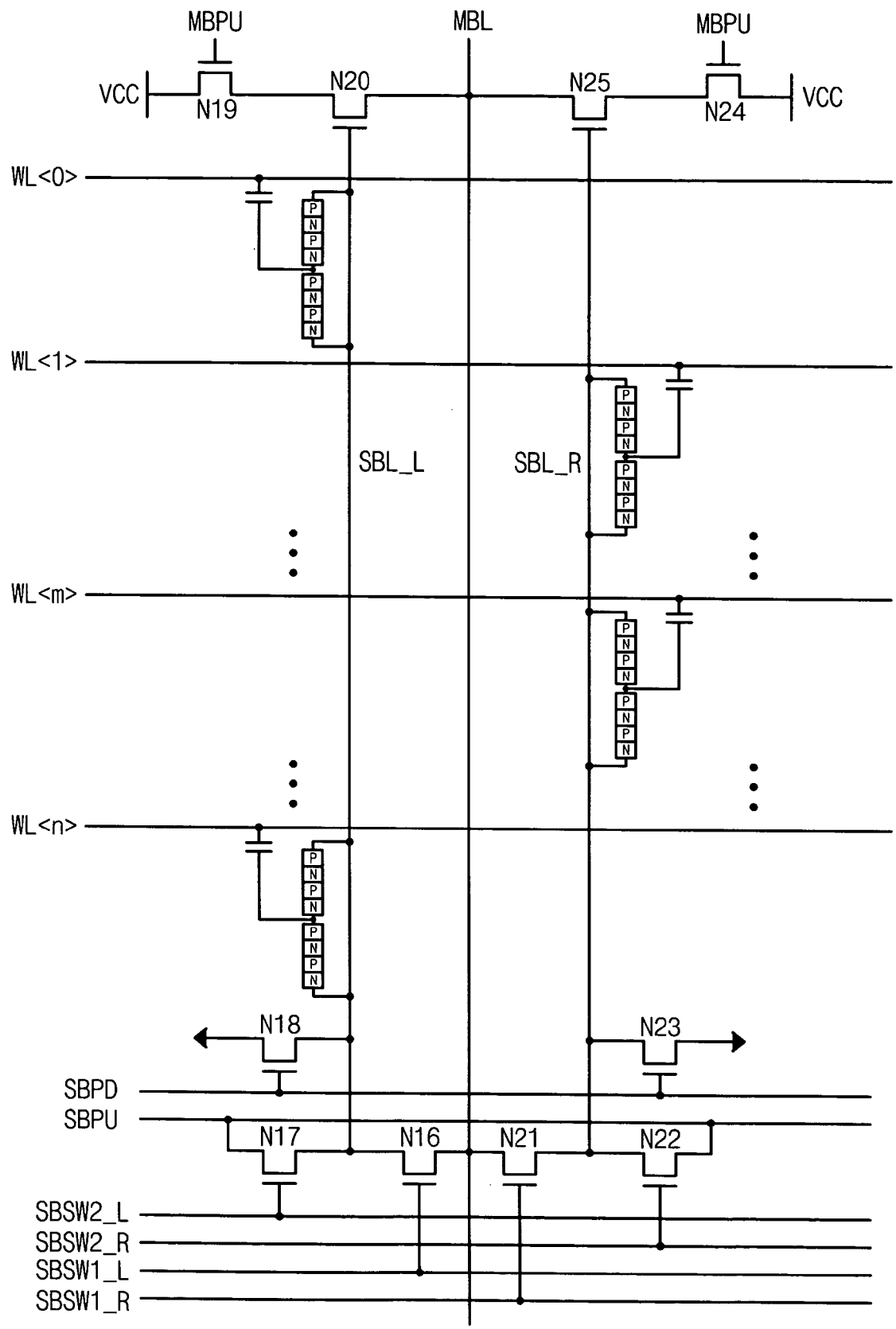
FIG. 11 is a detailed circuit diagram illustrating a third example of one sub cell array of FIG. 6.

FIG. 11 is a detailed circuit diagram illustrating a third example of one sub cell array of FIG. 6.

In each sub cell array, a main bit line MBL is shared by two sub bit lines SBL_L and SBL_R adjacent to the main bit line MBL in left and right sides. In addition, in each sub cell array, cells coupled to the two sub bit lines SBL_L and SBL_R corresponding to one main bit line MBL have a folded bit line structure not to share word lines WL<0> to WL<n>.

When a sub bit line select signal SBSW1_L or SBSW1_R is enabled, an NMOS transistor N16 or N21 is turned on, and thus a load of the main bit line MBL is applied as much as the sub bit line SBL_L or SBL_R. When the sub bit line pull-down signal SBPD is enabled, NMOS transistors N18 and N23 are turned on, and thus the sub bit lines SBL_L and SBL_R are pulled down to a ground voltage level. A sub bit line pull-up signal SBPU controls power supplied to the sub bit lines SBL_L and SBL_R. Sub bit line select signals SBSW2_L and SBSW2_R control signal flow between the sub bit line pull-up signal SBPU line and the sub bit lines SBL_L and SBL_R, by selectively turning on/off NMOS transistors N17 and N22.

In accordance with the present invention, the two sub bit lines SBL_L and SBL_R share one main bit line MBL, and thus are distinguished and controlled by using different sub bit line select signals SBSW1_L, SBSW1_R, SBSW2_L and SBSW2_R.

NMOS transistors N19 and N24 are coupled between a power voltage VCC and NMOS transistors N20 and N25, and have their gates connected to receive a main bit line pull-up signal MBPU. The NMOS transistors N20 and N25 are coupled between the NMOS transistors N19 and N24 and the main bit line MBL, and have their gates connected to the sub bit lines SBL_L and SBL_R. When the main bit line pull-up signal MBPU is enabled, the NMOS transistors N20 and N25 induce a sensing voltage of the main bit line MBL by controlling a volume of a current supplied to the main bit line MBL by the power voltage VCC according to the sensing voltage of the sub bit lines SBL_L and SBL_R.

As discussed earlier, in accordance with the present invention, the cell array circuit having the double bit line sensing structure includes the double bit line sensing structure for inducing the sensing voltage of the main bit line by using the current gain according to the cell data, and uses the PNPN diodes as the switch devices of the cell, thereby decreasing the cell size and improving the operational characteristics. Moreover, short channel problems are solved by maintaining the voltage level of the bit lines in 0V in the precharge period.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the metes and bounds of the claims, or equivalences of such metes and bounds are therefore intended to be embraced by the appended claims.

What is claimed is:

1. A nano tube cell, comprising:
   a capacitor for storing cell charges corresponding to a cell data, and having a first electrode of which being coupled to a word line;
   a first PNPN tube coupled between a second electrode of the capacitor and a bit line, and turned on when a voltage of the bit line is higher than that of the second electrode by a predetermined level, for enabling a current to flow from the bit line to the capacitor; and
   a second PNPN tube coupled between the second electrode and the bit line, and turned on when the voltage of the second electrode is higher than that of the bit line by a predetermined level, for enabling the current to flow from the capacitor to the bit line.

2. The nano tube cell of claim 1, wherein the first PNPN tube is a PNPN diode coupled between the second electrode and the bit line in the backward direction, and
   wherein the second PNPN tube is a PNPN diode coupled between the second electrode and the bit line in the forward direction.

3. The nano tube cell of claim 2, wherein the PNPN diodes composing the first PNPN tube and the second PNPN tube are connected in series in the orthogonal direction to the word line, for forming a serial PNPN tube chain.

4. The nano tube cell of claim 3, wherein the capacitor is formed in a cross region of the serial PNPN tube chain and the word line.

5. The nano tube cell of claim 4, wherein the capacitor comprises:
   a bottom electrode stacked above the serial PNPN tube chain in a column shape to be commonly connected to a N terminal positioned in the end of the first PNPN tube and a P terminal positioned in the end of the second PNPN tube through a contact node;
   a dielectric film stacked on the surface of the bottom electrode; and
   a top electrode stacked on the surface of the dielectric film and coupled to the word line.

* * * * *